(12) United States Patent
Soenen

(10) Patent No.: US 6,373,424 B1
(45) Date of Patent: Apr. 16, 2002

(54) METHOD AND APPARATUS FOR OBTAINING LINEARITY IN A PIPELINED ANALOG-TO-DIGITAL CONVERTER

(75) Inventor: Eric G. Soenen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/740,350

(22) Filed: Dec. 18, 2000

Related U.S. Application Data

(60) Provisional application No. 60/171,823, filed on Dec. 21, 1999.

(51) Int. Cl.[7] .......................... H03M 1/38; H03M 1/12; H03M 1/10; H03M 1/06
(52) U.S. Cl. ...................... 341/161; 341/118; 341/172; 341/120
(58) Field of Search ............................... 341/118, 120, 341/161, 162, 172

(56) References Cited

U.S. PATENT DOCUMENTS

| | | | |
|---|---|---|---|
| 5,404,142 A | | 4/1995 | Adams et al. |
| 5,684,482 A | | 11/1997 | Galton |
| 6,195,032 B1 | * | 2/2001 | Watson et al. ............... 341/162 |
| 6,222,478 B1 | * | 4/2001 | Bright .......................... 341/162 |
| 6,285,309 B1 | * | 9/2001 | Yu ............................... 341/161 |
| 6,295,016 B1 | * | 9/2001 | Chiang ......................... 341/161 |

OTHER PUBLICATIONS

Brooks, et al., "Wide–Bandwidth Oversampled ADC's"; Oversampled Delta–Sigma Data Converters Conference, Feb. 24, 1998; Monterey, California; 2 cover sheets and 17 pages (slides 1–53).

Brooks, et al., "FP13.1: A 16b ΣΔ Pipeline ADC with 2.5 MHz Output Data–Rate" 1997 IEEE International Solid–State Circuits Conference pp. 208–209 and 458.

Brooks, et al., "A Cascaded Sigma–Delta Pipeline A/D Converter with 1.25 MHz Signal Bandwidth and 89 dB SNR", IEEE Journal of Solid–State Circuits, vol. 32, No. 12, Dec. 1997, pp. 1896–1906.

Jensen, et al., "A Low–Complexity Dynamic Element Matching DAC for Direct Digital Synthesis", IEEE Transactions on Circuits and Systems—II: Analog and Digital Signal Processing, vol. 45, No. 1, Jan. 1998, pp. 13–27.

Galton, et al., "A Rigorous Error Analysis of D/A Conversion with Dynamic Element Matching", IEEE Transactions on Circuits and Systems—II: Analog and Digital Signal Processing, vol. 42, No. 12, Dec. 1995, pp. 763–772.

(List continued on next page.)

*Primary Examiner*—Patrick Wamsley
(74) *Attorney, Agent, or Firm*—W. Daniel Swayze, Jr.; Mark E. Courtney; Frederick J. Telecky, Jr.

(57) ABSTRACT

A pipelined analog-to-digital converter system (10) is responsive to an analog input signal (18). The system includes four pipeline stages (11–14), which each produce a respective digital output (26–29) that is coupled to a combining circuit (16). The combining circuit generates the digital output (41) of the system. Each pipeline stage includes an analog-to-digital converter (101), which generates the digital output for that stage. A shuffler circuit (103) randomly shuffles the bits of this digital output, in order to generate shuffled switching signals, which in turn are used to control electronic switches (206–209, 211–214) associated with several capacitors (C1–C4). By randomly shuffling the switching signals, the effects caused by variation of any capacitor from an ideal value are randomized. This avoids nonlinearity such as harmonic distortion in the analog output signal (21) from that stage.

19 Claims, 3 Drawing Sheets

OTHER PUBLICATIONS

L. Hernández, "Digital Implementation of Mismatch Shaping in Oversampled Pipeline A/D Converters", IEE 1998, Jan. 27, 1998, two pages.

Shabra, et al., "Oversampled Pipeline A/D Converters with Mismatch Shaping", IEE 1998, Dec. 18, 1997, two pages.

L. Hernández, "Binary Weighted D/A Converters with Mismatch Shaping", IEE 1997, Sep. 1, 1997, three pages.

Yu, et al., "A 2.5–V, 12–b, 5–Msample/s Pipelined CMOS ADC", IEEE Journal of Solid–State Circuits, vol. 31, No. 12, Dec. 1996, pp. 1854–1861.

Galton, "Digital Noise Cancellation in Pipelined Analog–to–Digital Converters", Sep. 28, 1998, pp. 1–16.

* cited by examiner

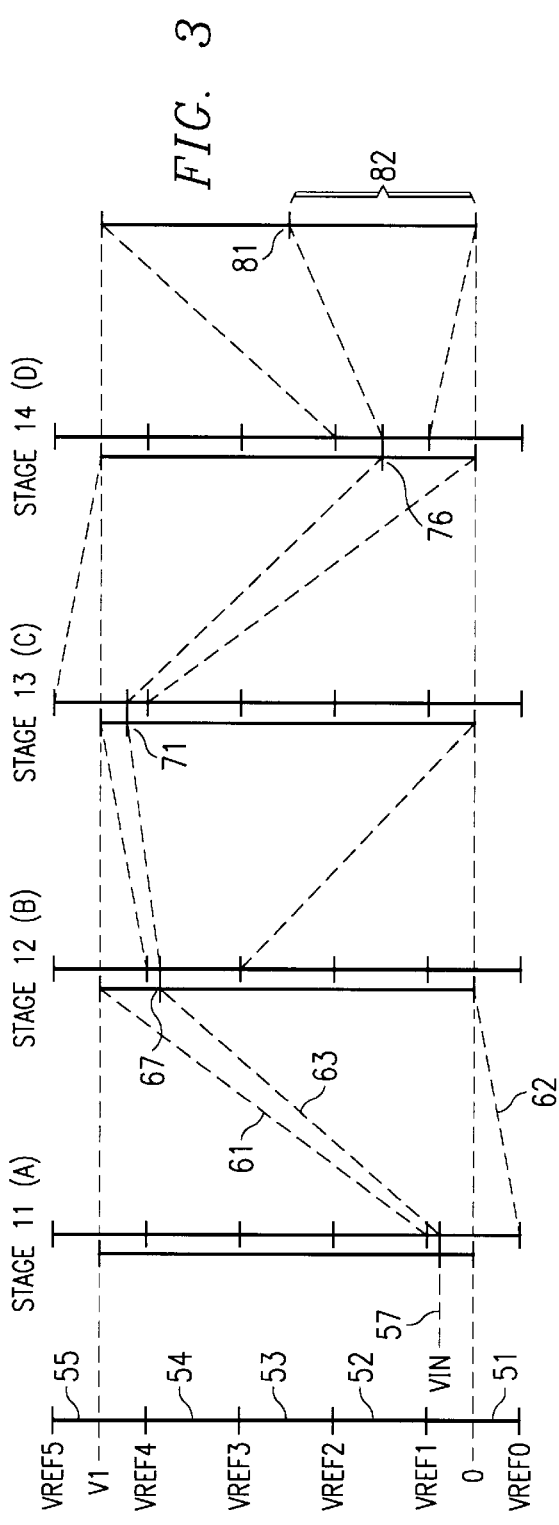
FIG. 3
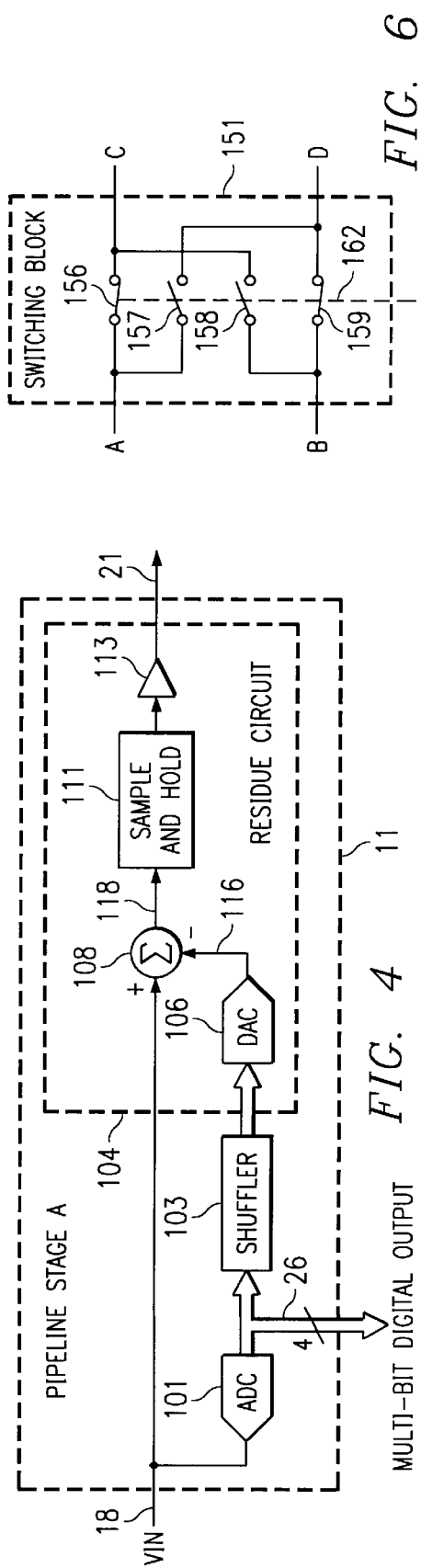
FIG. 6
FIG. 4

METHOD AND APPARATUS FOR OBTAINING LINEARITY IN A PIPELINED ANALOG-TO-DIGITAL CONVERTER

This application claims priority under 35 USC §119(e)(1) of provisional application No. 60/171,823 filed Dec. 21, 1999.

BACKGROUND OF THE INVENTION

There are a variety of different types of high-performance analog-to-digital converter circuits, including those commonly known as delta-sigma converters, and those commonly known as pipelined converters. The present invention relates to high-performance pipelined analog-to-converters. In the design of these pipelined converters, the designer is normally limited in the linearity that can be obtained. This is due primarily to accuracy limitations in reconstruction digital-to-analog converters which are used within the pipeline. This is particularly true for the reconstruction digital-to-analog converter in the first stage of the pipeline, since the accuracy of that stage has the greatest influence on the overall accuracy of the system.

Currently, the most common way to implement pipelined converters is to use switched capacitor techniques. In particular, a reconstruction digital-to-analog converter is implemented by providing a bank of capacitors, and by switching each of the capacitors between two reference levels under control of a digital code which is applied to the reconstructing converter for purposes of generating a corresponding analog signal. In theory, the capacitors should all have the same ideal capacitance value, but in practice there are usually variations. The accuracy or linearity of the reconstructing converter is therefore limited by the extent to which the capacitors can be matched to each other, or in other words the extent to which the capacitors can be manufactured so that variations from an ideal capacitance value are minimized. To the extent that there is mismatch between the capacitors in a reconstructing converter in a stage of a pipeline converter, the result is undesirable error in the analog residue signal passed to a subsequent stage, which results in harmonic distortion in the digital output of the overall pipelined analog-to-digital converter. Although it is possible to address this problem to some extent through trim or background calibration of the capacitors, this is often not an efficient or desirable approach.

SUMMARY OF THE INVENTION

From the foregoing, it may be appreciated that a need has arisen for a method and apparatus of effecting pipelined analog-to-digital conversion in a manner which reduces or avoids nonlinearities such as harmonic distortion. According to the present invention, a method and apparatus are provided to address this need, and involve effecting pipelined analog-to-digital conversion in first and second stages of conversion which each use an analog input to facilitate generation of an analog output and a multi-bit digital output, the analog input of one of the first and second stages being derived from the analog output of the other of the first and second stages. The first stage of conversion involves effecting an analog-to-digital conversion of the analog input of the first stage so as to generate a multi-bit digital output that is based on the analog input of the first stage and that serves as the multi-bit digital output of the first stage. The first stage further involves shuffling a plurality of switching signals derived from the multi-bit digital output of the analog-to-digital conversion so as to generate a plurality of shuffler output signals, the shuffling being effected according to a mapping function which relates each shuffler output signal to a respective switching signal, and the shuffling including dynamic variation of the mapping function so as to dynamically vary which of the shuffler output signals corresponds to which of the switching signals. The first stage also involves generating an analog residue signal which represents a difference between a magnitude corresponding to the analog input of the first stage and a magnitude corresponding to the multi-bit digital output of the analog-to-digital conversion, including selective switching of each of a plurality of circuit portions to one of first and second states in response to a respective shuffler output signal, the first and second states being different, and the analog residue signal serving as the analog output of the first stage, and having a magnitude which is a function of the number of the circuit portions which are switched so as to be in the first state.

BRIEF DESCRIPTION OF THE DRAWINGS

A better understanding of the present invention will be realized from the detailed description which follows, taken in conjunction with the accompanying drawings, in which:

FIG. 3 is a diagrammatic representation of the analog-to-digital conversion process implemented by the system of FIG. 1;

FIG. 4 is a block diagram of the circuitry within one of the pipeline stages of the system of FIG. 1;

FIG. 6 is a schematic diagram which is an enlarged view of a portion of the circuitry of FIG. 5.

DETAILED DESCRIPTION OF THE INVENTION

Figure 1:
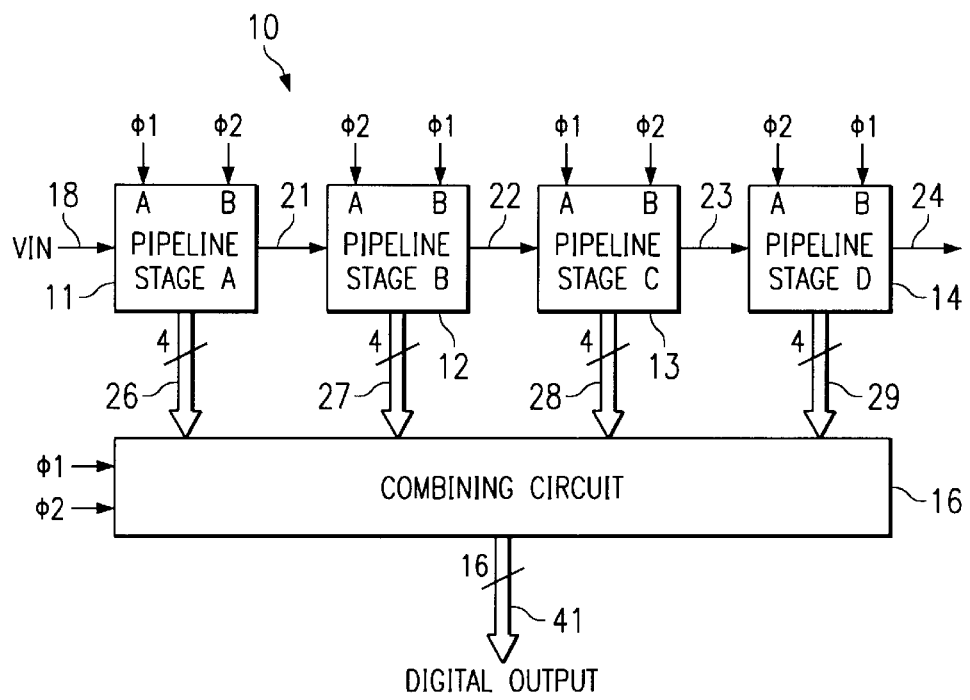
FIG. 1 is a block diagram of a pipelined analog-to-digital converter system which embodies the present invention.

FIG. 1 is a block diagram of a pipelined analog-to-digital converter (ADC) system 10, which embodies the present invention. The system 10 includes four pipeline stages A–D that are respectively identified with reference numerals 11–14, and includes a combining circuit 16. The pipeline stage 11 has an analog input, where it receives an analog input signal VIN at 18. The pipeline stages 11–14 produce respective analog outputs 21–24, which each represent a residue. The analog outputs 21–23 from the pipeline stages 11–13 are respectively coupled to the analog inputs of the pipeline stages 12–14. The analog output 24 from stage 14 is ignored in the disclosed embodiment.

The pipeline stages 11–14 produce respective multi-bit digital outputs 26–29. In the disclosed embodiment, each of the multi-bit digital outputs 26–29 has four bits, which represent a digital number in a form commonly in the art as a thermometer code, as discussed in more detail later. The multi-bit digital outputs 26–29 are each coupled to a respective digital input of the combining circuit 16, which is discussed later.

At any given point in time, the pipeline stages 11–14 are each processing a respective different sample of the analog input signal 18. For example, focusing on four successive hypothetical samples of the analog input signal 18, when the last pipeline stage 14 is processing the first sample, the pipeline stage 13 will be processing the second sample, the pipeline stage 12 will be processing the third sample, and the pipeline stage 11 will be processing the fourth sample. The fact that the pipeline stages 11–14 process several samples in parallel is the reason why the system 10 is referred to as a "pipelined" system.

The pipeline stages 11–14 each have two clock inputs A and B. A first clock signal φ1 is applied to one of the clock inputs A and B of each pipeline stage 11–14, and a different clock signal φ2 is applied to the other clock input thereof. It will be noted in FIG. 1 that the order of the clock signals alternates from stage to stage. In particular, it will be noted that the pipeline stages 11 and 13 each have the clock signal φ1 applied to the A input and the clock signal φ2 applied to the B input, whereas the pipeline stages 12 and 14 each have the clock signal φ2 applied to the A input and the clock signal φ1 applied to the B input.

Figure 2:
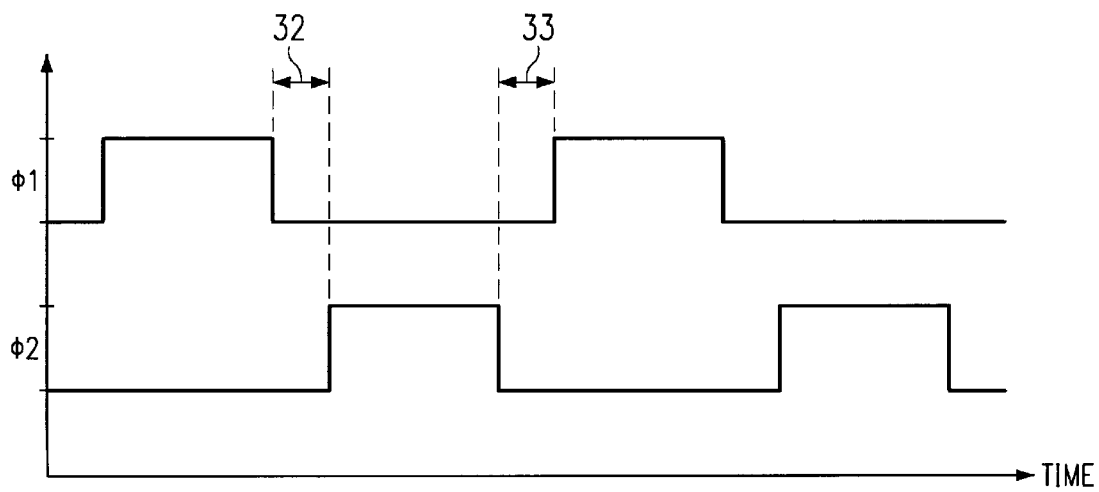
FIG. 2 is a timing diagram which shows two clock signals that are utilized in the system of FIG. 1.

The clock signals φ1 and φ2 have the same frequency, but are 180° out of phase with respect to each other. This relationship is depicted in the timing diagram of FIG. 2. It will be noted from FIG. 2 that the duty cycle of each of these clock signals is less than 50%, so there is a delay 32 between the falling edge of the clock signal φ1 and the leading edge of the clock signal φ2, and there is a delay 33 between the falling edge of the clock signal φ2 and the leading edge of the clock signal φ1. In other words, the clock signals φ1 and φ2 are never a logic high at the same time. Consequently, clock signals φ1 and φ2 are considered to be non-overlapping clock signals.

Referring again to FIG. 1, the combining circuit 16 is a circuit of a known type, and is responsive to the multi-bit digital outputs 26–29 of the pipeline stages 11–14 for producing a further multi-bit digital output 41, which is the overall digital output of the pipelined ADC system 10. In the disclosed embodiment, the digital output 41 has sixteen bits. This does not represent a simple summation of the four 4-bit inputs 26–29, because as discussed below the signals 26–29 are thermometer codes which include a level of redundancy, and combining the digital outputs 26–29 thus requires more sophisticated processing than simply coupling each of the sixteen input lines at 26–29 to a respective one of the sixteen output lines 41.

In this regard, and as mentioned above, at any given point in time the pipeline stages 11–14 are each processing a respective different sample of the analog input signal. In view of this pipelined processing, a given hypothetical sample will first be processed in stage 11, then processed in stage 12, thereafter processed in stage 13, and subsequently processed in stage 14. Consequently, the output 26 from stage 11 for the hypothetical sample will need to be stored until stages 12–14 have each processed the hypothetical sample. Similarly, the outputs at 27 and 28 for that hypothetical sample will need to be stored until the sample has been processed by the stage 14. Thus, for example, each of the outputs 26–28 for the hypothetical sample may be stored by the combining circuit 16 in a respective not-illustrated shift register until the output 29 is valid for the hypothetical sample, at which point all multi-bit digital outputs for that sample may be combined in order to produce a corresponding digital output 41.

FIG. 3 is a diagrammatic view showing how the pipelined ADC of FIG. 1 operates. At the far left side of FIG. 3 is a vertical line which shows a range of voltages from VREF0 to VREF5. This range is subdivided into five equal segments 51–55, where voltages VREF1 through VREF4 each serve as the dividing line between a respective adjacent pair of the segments 51–55. Voltages V0 and V1 respectively represent the minimum and maximum values which the analog input signal VIN (18 in FIG. 1) should be between. For purposes of the example shown in FIG. 3, the analog input voltage VIN is hypothetically assumed to have the value shown at 57, which is greater than the minimum V0 and slightly less than the reference voltage VREF1.

In each of the pipelined stages 11–14, a voltage will be evaluated relative to the range from VREF0 to VREF5, in order to determine which of the segments 51–55 it falls within. TABLE 1 has five rows which each correspond to one of the segments 51–55, and shows the associated voltage range as well as the particular multi-bit digital output which will be produced at a corresponding one of the digital outputs 26–29. In the digital outputs shown in TABLE 1, it will be noted that the number of binary ones is increased by one from each successive code to the next, and any binary ones which are present are grouped toward the right side of the word. In other words, the leftmost binary one works its way progressively to the left in successive steps as the input voltage VIN is progressively increased from the minimum V0 to the maximum V1, much like the column of mercury in a thermometer increases progressively in length as the temperature increases. Hence the name "thermometer code".

TABLE 1

| Between Voltages | Segment | Multi-Bit Digital Output |
| --- | --- | --- |
| VREF0 and VREF1 | 51 | 0000 |
| VREF1 and VREF2 | 52 | 0001 |
| VREF2 and VREF3 | 53 | 0011 |
| VREF3 and VREF4 | 54 | 0111 |
| VREF4 and VREF5 | 55 | 1111 |

Since the hypothetical voltage 57 is greater than VREF0 and is slightly less than VREF1, it will be noted from TABLE 1 that stage 11 will produce a multi-bit digital output at 26 which is the thermometer code "0000". In fact, it will be noted that this same particular thermometer code "0000" will be produced if the voltage 57 is anywhere between VREF0 and VREF1. In effect, this code represents the voltage VREF0. The portion of the hypothetical VIN signal 57 which is above this voltage VREF0, or in other words the difference between the voltage 57 and the voltage VREF0, is considered to be the "residue" of stage 11, and is passed along as an analog signal at 21 (FIG. 1) for processing by the next stage 12. However, before passing along this analog signal, the stage 11 amplifies it, as indicated diagrammatically in FIG. 3 by the diverging broken lines 61 and 62. In this regard, as shown diagrammatically in FIG. 3, the gain of this amplification is selected so as to correspond to mapping of the segment 51 to a magnitude equal to the difference between V1 and V0. The residue voltage, which is the voltage 57 less the reference voltage VREF0, is mapped in a proportional manner, as shown diagrammatically by broken line 63. Thus, the input to stage 12 is effectively a scaled voltage 67 which represents the amplified residue of the first stage 11.

Stage 12 processes the voltage 67 in effectively the same manner that stage 11 processed the voltage 57. In particular, and with reference to TABLE 1, since the hypothetical voltage 67 is between VREF4 and VREF5, stage 12 will produce at 27 (FIG. 1) a multi-bit digital output which is the thermometer code "0111". This effectively corresponds to reference voltage VREF3 in stage 12. The residue is the difference between the voltage 67 and VREF3. This residue is amplified by stage 12 in a manner which effectively corresponds to mapping of the segment 54 to a magnitude corresponding to the difference between V1 to V0. The voltage level 67 is mapped proportionally, producing a voltage 71, which appears at 22 in FIG. 1.

Stage 13 then performs a similar operation, producing a multi-bit output of "1111", and performing amplification on the residue which corresponds to mapping of segment 55 to a magnitude corresponding to the difference between V1 and V0. The voltage 71 is mapped proportionally into a scaled voltage 76, which is supplied to stage 14 at 23 (FIG. 1).

Stage 14 then carries out analogous processing, producing a multi-bit digital output "0001", and effecting amplification of the residue which effectively corresponds to mapping of the segment 52 to a magnitude corresponding to the difference between V1 and V0. The level 76 is mapped proportionally, to a voltage level 81. The difference between voltage 81 and voltage V0 represents the final residue 82, which is output from stage 14 at 24 (FIG. 1), but which is not utilized in the disclosed embodiment.

In the disclosed embodiment, the pipelined stages 11–14 each have internal circuitry which is the same. Accordingly, only one of the stages 11–14 is described in detail below, in particular the first stage 11. More specifically, FIG. 4 is a block diagram showing the circuitry within the first pipeline stage 11. FIG. 4 shows that the analog input voltage VIN received at 18 is applied to the input of an ADC 101. The ADC 101 effectively evaluates the present value of the analog input voltage VIN relative to the reference voltages VREF0 through VREF5 (FIG. 3), and outputs at 26 a multi-bit digital output which is one of the five codes shown in the right column of TABLE 1, and which serves as the multi-bit digital output 26 from the first stage 11. As discussed above in association with FIG. 3 and TABLE 1, this code effectively identifies one of the five reference voltages VREF0 to VREF4 which is closest to but less than the current value of VIN.

A shuffler circuit 103 and a residue circuit 104 are then used to determine the residue amount, or in other words the amount by which the current voltage VIN exceeds the particular one of the reference voltages VREF0 to VREF4 which is identified by the multi-bit digital output 26. In order to facilitate this, the residue circuit 104 includes a reconstruction digital-to-analog converter (DAC) circuit 106, a summation block 108 which functions as a substracter, a sample and hold circuit 111, and an amplifier 113.

The shuffler circuit 103 has four inputs and four outputs, the four inputs each being coupled to a respective bit of the multi-bit digital output 26. The shuffler circuit 103 couples each of its inputs to a respective one of its outputs, according to a one-to-one mapping pattern. In addition, however, the shuffler 103 dynamically varies this mapping pattern in a substantially random manner. The outputs of the shuffler circuit 103 are coupled to inputs of the DAC 106, and facilitate control of the DAC 106 in a manner which will be described in more detail later.

The output 116 of the DAC 106 is coupled to the minus input of the summation block 108, and the analog input voltage VIN is coupled to the plus input of block 108. As mentioned above, the multi-bit digital output 26 effectively represents one of the reference voltages VREF0 through VREF4. The shuffler circuit 103 and DAC 106 are designed to "reconstruct" that particular reference voltage, so as to output at 116 an analog voltage which is effectively equal to that particular reference voltage. As noted above, block 108 functions to effectively subtract the signal 116 from the signal VIN, where the analog voltage 116 represents the reference voltage VREF0 to VREF4 which is closest to but less than the input voltage VIN. This difference is output by block 108 at 118, and is effectively the residue value for stage 11, as discussed earlier in association with FIG. 3. Sample and hold block 111 periodically samples the current value of analog difference signal 118, and holds the sample value until the next sample is taken. The sample value held by circuit 111 is amplified by the amplifier 113, and the output of amplifier of 113 is the analog output signal 21, or in other words the amplified residue signal.

Figure 5:
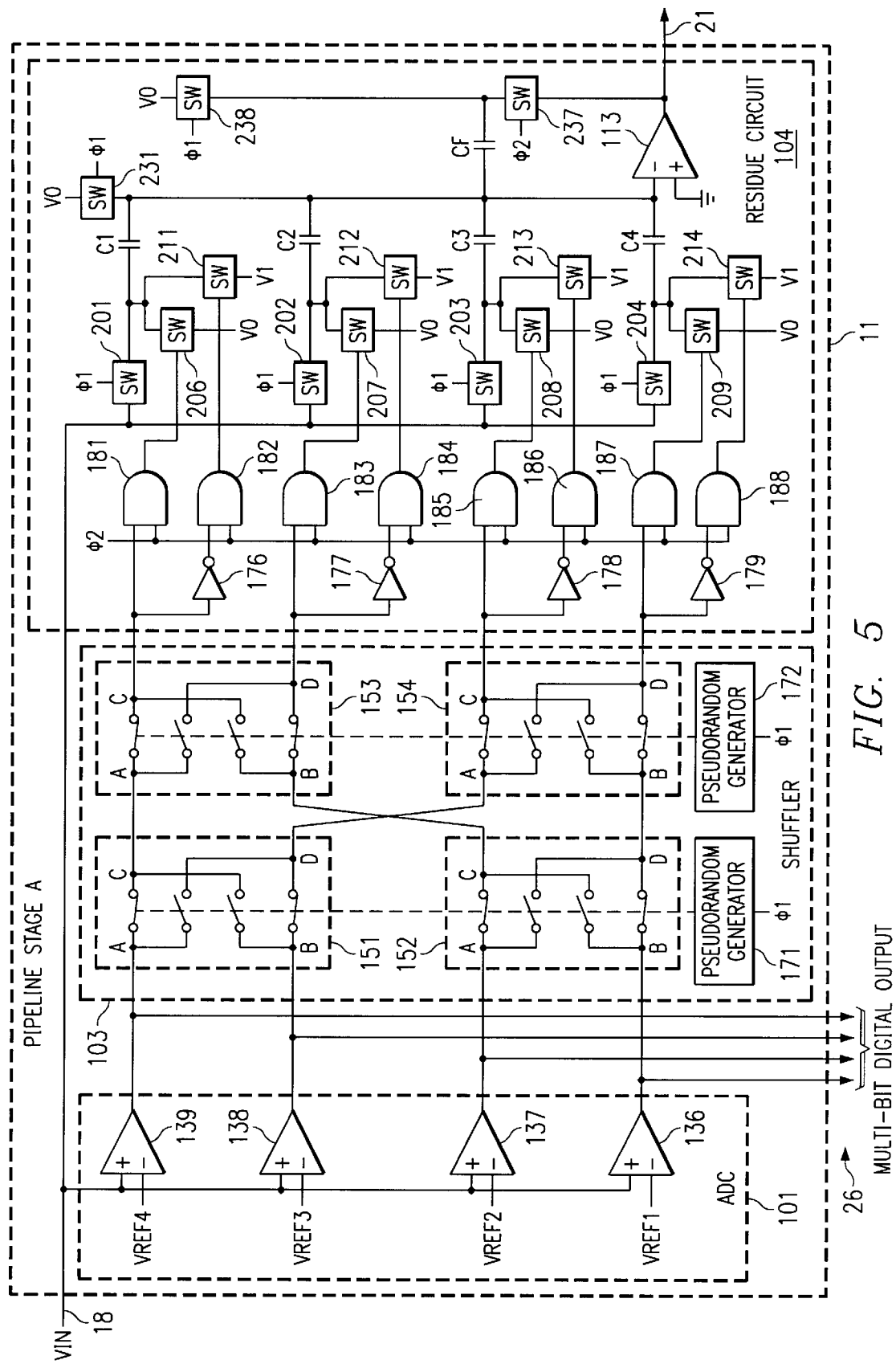
FIG. 5 is a schematic diagram which shows in detail the circuitry within the pipeline stage of FIG. 4.

FIG. 5 is a schematic circuit diagram which shows the circuitry within pipeline stage 11 in a greater level of detail than the block diagram of FIG. 4. Referring to FIG. 5, the ADC 101 includes four analog comparators 136–139, which each compare the analog input voltage VIN received at 18 to a respective one of the four reference voltages VREF1 to VREF4. The outputs of the comparators 136–139 directly and collectively serve as the multi-bit digital output from the ADC 101, as well as the multi-bit digital output 26 from the pipeline stage 11.

The shuffler circuit 103 contains a switching network, which includes four switching blocks 151–154. The switching blocks 151–154 are identical to each other, and the switching block 151 is shown in an enlarged scale in the schematic diagram of FIG. 6. More specifically, with reference to FIG. 6, the switching block 151 has two inputs A and B, and two outputs C and D. It contains four electronic switches, which are diagrammatically represented at 156–159. Switches 156 and 157 each have their left terminal coupled to the input A, and switches 158 and 159 each have their left terminal coupled to the input B. Switches 156 and 158 each have their right terminal coupled to output C, and switches 157 and 159 each have their right terminal coupled to output D. The switches 156–159 are all operated in unison, as indicated diagrammatically by broken line 162. The switching block 151 basically has two operational states. In the first operational state, the outer switches 156 and 159 are closed, and the inner switches 157 and 158 are open. In the other operational state, the inner switches 157 and 158 are closed, and the outer switches 156 and 159 are open.

Referring again to FIG. 5, it will be noted that switching block 151 has its inputs A and B respectively coupled to the outputs of comparators 139 and 138, and switching block 152 has its inputs A and B respectively coupled to the outputs of comparators 137 and 136. Switching block 153 has its inputs A and B respectively coupled to output C of switching block 151, and output C of switching block 152. Switching block 154 has its inputs A and B respectively coupled to output D of switching block 151, and output D of switching block 152. Switching blocks 151 and 152 represent a first level or stage of switching within the shuffler circuit 103, and switching blocks 153 and 154 represent a second level or stage of switching in the shuffler circuit 103. It will be recognized that each of the four inputs to shuffler circuit 103 will always be coupled to one and only one of the four outputs thereof.

The shuffler circuit 103 includes two pseudorandom generators 171 and 172, which are driven by the clock φ1 and which each produce a single digital output signal. Pseudorandom generators 171 and 172 operate completely independently of each other, and produce respective independent output signals which are different pseudorandom sequences. The output signal from pseudorandom generator 171 controls each of the switches in switching blocks 151 and 152, and the output signal from pseudorandom generator 172 controls each of the switches in switching blocks 153 and 154. Depending on the states of the switches in the switching blocks 151–154, any input of the shuffler circuit 103 can be selectively coupled to any output thereof.

As the pseudorandom generators 171 and 172 operate to substantially randomly open and close the electronic switches within the shuffler circuit 103, the effective mapping pattern for the coupling of inputs to outputs will be dynamically varied in a pseudorandom manner. More specifically, since the pseudorandom generators 171 and 172 each produce a close approximation of a random sequence, and since these two sequences are independent, each of the four inputs to the shuffler circuit 103 has, over time, a substantially equal probability of being coupled to each of the four outputs thereof. Stated differently, any given input should be operatively coupled to any given output about 25% of the time. The signals at the inputs to the shuffler circuit 103 may effectively be considered to be switching signals, and the outputs of the shuffler circuit 103 may effectively be considered be shuffled switching signals.

The residue circuit 104 of the disclosed embodiment includes four inverters 176–179, which each have an input coupled to a respective one of the four outputs of the shuffler circuit 103. The residue circuit 104 also includes eight two-input AND gates 181–188, which have a first input coupled to the clock signal φ2. The four AND gates 181, 183, 185 and 187 each have their second input coupled to a respective output of the shuffler circuit 103. The remaining four AND gates 182, 184, 186, and 188 each have their second input coupled to the output of a respective one of the inverters 176–179. Gates 181–188 will thus be enabled only when the clock φ2 is a logical high. When they are enabled, gates 181, 183, 185 and 187 will each output a signal which is identical to a respective one of the outputs of the shuffler circuit 103. When gates 182, 184, 186 and 188 are enabled, they will each output a signal which is the inverse of a respective one of the outputs of shuffler circuit 103.

The residue circuit 104 includes four capacitors C1–C4. The left terminal of each of the capacitors C1–C4 is coupled through a respective electronic switch 201–204 to the analog input voltage VIN. The electronic switches 201–204 are all controlled by the clock φ1, and in particular are open when the clock φ1 is a logic low and are closed when the clock φ1 is a logic high. The left terminal of each of the capacitors C1–C4 is also coupled through a respective electronic switch 206–209 to the voltage V0. These switches 206–209 are each controlled by the output of a respective one of the gates 181, 183, 185 and 187. The left terminal of each of the capacitors C1–C4 is further coupled through a respective electronic switch 211–214 to the voltage V1, the switches 211–214 each being controlled by the output of a respective one of the gates 182, 184, 186 and 188.

The right terminals of the capacitors C1 through C4 are all coupled to each other, and are coupled through an electronic switch 231 to the voltage V0. The switch 231 is controlled by the clock signal φ1. The right terminals of the capacitors C1–C4 are also all coupled to the minus input of the differential amplifier 113, which was discussed above in association with FIG. 4, and which is a differential amplifier. The plus input of the amplifier 113 is coupled to ground, and the output of the amplifier 113 serves as the output 26 of the pipeline stage 11.

A feedback capacitor CF has its left terminal coupled to the minus input of amplifier 113, and has its right terminal coupled through an electronic switch 237 to the output 21 of amplifier 113. The switch 237 is controlled by the clock signal φ2. The right terminal of capacitor CF is also coupled through a further electronic switch 238 to the voltage V0. The electronic switch 238 is controlled by the clock signal φ1.

The following is an explanation of the operation of the circuitry of the pipeline stage 11 which is shown in FIG. 5. The ADC 101 compares the analog input voltage VIN to the reference voltages VREF1 through VREF4, in order to produce the 4-bit digital output 26 which is a thermometer code of the type shown in TABLE 1. For purposes of this discussion, it is assumed that the thermometer code is presently "1111". The shuffler circuit 103 couples each of its four inputs to a respective one of its four outputs. Since it is presently being assumed that all of the inputs are ones, all of the outputs will also be ones, regardless of the particular mapping pattern.

The pipeline stage 11 processes the input signal VIN in two phases. During the first phase, the clock signal φ1 is a logic high and, during the second phase, the other clock signal φ2 is a logic high. Consequently, during the first phase, the gates 181–188 will be disabled, and will in turn keep each of the switches 206–209 and 211–214 in an open state. The switch 237 is controlled by clock signal φ2, and will thus also be in an open state. The remaining switches 201–204, 231 and 238 are each controlled by the clock signal φ1, and will be in a closed state during the first phase, where they are each conducting. It will be noted that the two ends of the feedback capacitor CF are coupled through the respective switches 231 and 238 to the voltage V0, so that capacitor CF is effectively discharged. Capacitors C1 through C4 each have their right terminal coupled through switch 231 to voltage V0, and have their left terminal coupled through a respective one of the switches 201–204 to the voltage VIN. Consequently, each of the capacitors C1 to C4 will be charged to a voltage corresponding to the difference between VIN and V0.

When the clock signal φ1 changes to a logic low, switches 201–204, 231 and 238 will each be switched to an open state. Each of the capacitors CF and C1–C4 will substantially maintain the voltage to which it has been charged. Shortly thereafter, the clock signal φ2 will change to a logic high, thereby closing the switch 237 and enabling the gates 181–188. As mentioned above, it is being assumed for purposes of this discussion that the outputs of the shuffler circuit 103 are all a logic high. Consequently, the gates 181, 183, 185 and 186 will each be outputting a logic high which closes a respective one of the switches 206–209, and the gates 182, 184, 186 and 188 will each be outputting a logic low which opens a respective one of the switches 211–214.

Because the switch 237 has closed, the feedback capacitor CF will now be effectively coupled between the output and the minus input of amplifier 113. Further, since switches 206 and 209 have just closed, the left terminal of each of the capacitors C1–C4 will be coupled to the voltage V0. Since each of the capacitors C1–C4 was charged to a value corresponding to (VIN−V0), and since the left terminal of each of the capacitors C1 to C4 has now been directly coupled to V0, the right terminal of each of capacitors C1 to C4 and the left terminal of capacitor CF will be forced to −(VIN−V0). The differential amplifier 113 has an high impedance input, and thus the change in potential which has just occurred at its minus input cannot be rapidly resolved by a flow of current at the minus input. Consequently, the voltage which appears at the left side of the feedback capacitor CF will be coupled to and appear at its right terminal, which is coupled through switch 237 to the output of amplifier 113. The amplifier 113 will effect a current flow at its output which will adjust the charge across feedback capacitor CF, so as to bring the voltage at the minus input of the amplifier back to an appropriate value.

In an ideal world, the capacitors C1–C4 would all have precisely equal values. In the real world, however, due to manufacturing process variations, these capacitors will not have precisely equal values. Consequently, if the shuffler circuit 103 was not present, each bit of the multi-bit output 26 from the ADC 101 would always effect control of the same one of the capacitors C1–C4. For example, with reference to the right column of TABLE 1, if the right bit of the multi-bit output was always controlling capacitor C4, and the left bit was always controlling capacitor C1, it will be evident that capacitor C4 would be used a much greater percentage of the time than the capacitor C1. Consequently, if capacitor C4 varied from an ideal value, it would introduce a nonlinearity into the outputs of the stage 11, due to the fact that it is statistically used more frequently than any of the other capacitors. The other capacitors C1–C3 can each introduce nonlinearity in a similar manner. Thus, variation of each of the capacitors C1–C4 from an ideal value tends to introduce a non-random error which, with reference to FIG. 4, corresponds to non-random error introduced into the analog signal 116. This would appear in the form of harmonics in the frequency domain in the signal 116, which would carry through to the signal 21 and affect the overall accuracy of the pipelined ADC system 10 shown in FIG. 1.

According to the invention, however, this is avoided. More specifically, in the disclosed embodiment, the shuffler circuit 103 ensures that each of the outputs of the ADC 101 is switched substantially randomly with respect to control of the capacitors C1–C4, so that statistically it controls each of these capacitors approximately 25% of the time. This has the result that, although the variations from ideal in the values of the capacitors C1–C4 can still introduce error, the error is randomized and therefore tends to appear in the form of a higher noise floor, rather than as harmonics in the frequency domain.

Although the disclosed embodiment effects switching among the four capacitors C1–C4, it would alternatively be possible to use a variation of the circuit of FIG. 5, in which the feedback capacitor is included in the switching. In other words, switching would be effected among the five capacitors C1–C4 and CF, rather than among just the four capacitors C1–C4.

In many of the applications for a pipelined converter, the advantage of avoiding harmonics and obtaining a higher degree of accuracy greatly outweighs any disadvantage which may be associated with a higher noise floor. A further consideration is that randomization of the noise results in greatly improved distortion performance, especially when expressed in terms of spurious-free dynamic range (SFDR). In many applications, the improvement in SFDR is considered more important than the increased noise floor. For example, this is true of applications like cellular base stations and software radios, where it is typical that only a narrow frequency band out of the entire spectrum contains a signal, and the noise in that narrow band is limited.

Yet another consideration is that it is possible to operate the system 10 of FIG. 1 in an oversampling mode, and apply decimation to the digital output 41. This results in reduced noise, and also improved distortion performance in a smaller signal bandwidth than would be the case when oversampling and decimation are not used. In particular, when oversampling and decimation are used, it is possible to shape the noise, or in other words to move noise energy to frequencies that are of less interest and that get filtered out by the decimation process.

The present invention provides a number of technical advantages. One such advantage is that the effect of variation of the capacitors from ideal values is randomized, resulting in an increased noise floor rather than harmonic distortion, which greatly increases the overall accuracy of the system. A related technical advantage is that this can be achieved through the use of only a small amount of additional circuitry, and thus without greatly increasing the complexity and cost of the overall pipelined ADC. The randomization results in greatly improved distortion performance, especially when evaluated in terms of SFDR. Still another advantage is that no trim or background calibration is needed. Further, the method and apparatus according to the invention operate in parallel with and as an integral part of the conversion process, without delaying or otherwise interfering with the conversion process.

Although one embodiment has been illustrated and described in detailed, it should be understood that various substitutions and alterations can be made therein without departing from the scope of the present invention. For example, as noted above, it is possible to utilize the method and apparatus of the invention in association with oversampling and decimation. Another example is that the disclosed embodiment uses a shuffler circuit in each stage of the pipeline in order to effect randomization, but it would be possible to have some pipeline stages that utilize the present invention and some that do not. One such possibility would involve utilization of the present invention in just the first stage of a pipeline, and to implement subsequent stages of that pipeline with known circuitry which does not embody the present invention.

Yet another example is that each pipeline stage in the disclosed embodiment produces a digital output which includes four bits, but the present invention is compatible use of a larger or small number of bits. Still another example is that the shuffler circuit of the disclosed embodiment includes several switching blocks which each have identical circuitry therein, but it would be possible to use switching blocks that contain some other circuit configuration, or that are not identical to each other. Another example is that, even though the disclosed embodiment effects switching among a group of capacitors which does not include the feedback capacitor, it would alternatively be possible to include the feedback capacitor in the group.

It should also be recognized that direct connections disclosed herein could be altered, such that two disclosed elements would be coupled to one another through an intermediate element or elements without being directly connected, while still realizing the present invention. Other substitutions and alterations are also possible without departing from the spirit and scope of the present of the present invention, as defined by the following claims.

What is claimed is:

1. An apparatus, comprising a pipelined analog-to-digital converting circuit which includes first and second stages that each have an analog input, an analog output, and a multi-bit digital output, said analog input of one of said first and second stages being coupled to said analog output of the other of said first and second stages, and said first stage including:

an analog-to-digital converter responsive to said analog input of said first stage for generating a multi-bit digital output that is based on said analog input of said first stage and that serves as said multi-bit digital output of said first stage;

a shuffler having a plurality of inputs and a plurality of outputs, each said input of said shuffler having applied thereto a respective one of a plurality of switching signals derived from said multi-bit digital output of said analog-to-digital converter, said shuffler being operative to couple each said input thereof to a respective said output thereof according to a mapping function, and being further operative to dynamically vary said mapping function so as to dynamically vary which of said inputs thereof is coupled to which of said outputs thereof; and circuitry for generating an analog residue signal which represents a difference between a magnitude corresponding to said analog input of said first stage and a magnitude corresponding to said multi-bit digital output of said analog-to-digital converter, said circuitry including a plurality of circuit portions which can each be selectively switched to one of first and second states under control of a respective signal received from a respective one of said outputs of said shuffler, said first and second states being different, and said analog residue signal serving as said analog output of said first stage, and having a magnitude which is a function of the number of said circuit portions which are switched so as to be in said first state.

2. An apparatus according to claim 1, wherein said circuit portions each include a circuit component having one terminal which is switched to one of two different states in dependence on the state of a respective one of said outputs of said shuffler.

3. An apparatus according to claim 2, wherein said one terminal of each said circuit component is coupled to said analog input of said first stage during a first time interval, and is switched to one of said two different states during a second time interval subsequent to said first time interval.

4. An apparatus according to claim 3, wherein said circuit portions each have a further terminal which is operatively coupled to said analog output of said first stage during said second time interval.

5. An apparatus according to claim 2, wherein each said circuit component is a capacitor.

6. An apparatus according to claim 5, wherein said one terminal of each said capacitor is coupled to said analog input of said first stage during a first time interval, and is coupled to one of two different voltages during a second time interval subsequent to said first time interval; and wherein said two different states each correspond to said one terminal being coupled to a respective one of said two different voltages.

7. An apparatus according to claim 1, wherein said shuffler is operative to effect the variation of said mapping function in a substantially random manner.

8. An apparatus according to claim 7, wherein said shuffler includes a network of switches, said network including first and second groups of switches which are mutually exclusive, said switches of said first group each being switched by a first substantially random signal, and said switches of said second group each being switched by a second substantially random signal which is independent of said first substantially random signal.

9. An apparatus according to claim 8, wherein each said switching signal passes successively through a switch in said first group and a switch in said second group.

10. An apparatus according to claim 1, wherein said second stage includes:

a further analog-to-digital converter responsive to said analog input of said second stage for generating a multi-bit digital output that is based on said analog input of said second stage and that serves as said multi-bit digital output of said second stage;

a further shuffler having a plurality of inputs and a plurality of outputs, each said input of said further shuffler having applied thereto a respective one of a plurality of switching signals derived from said multi-bit digital output of said further analog-to-digital converter, said further shuffler being operative to couple each said input thereof to a respective said output thereof according to a further mapping function, and being further operative to dynamically vary said further mapping function so as to dynamically vary which of said inputs thereof is coupled to which of said outputs thereof; and further circuitry for generating a further analog residue signal which represents a difference between a magnitude corresponding to said analog input of said second stage and a magnitude corresponding to said multi-bit digital output of said further analog-to-digital converter, said further circuitry including a plurality of further circuit portions which can each be selectively switched to one of third and fourth states under control of a respective signal received from a respective one of said outputs of said further shuffler, said third and fourth states being different, and said further analog residue signal serving as said analog output of said second stage, and having a magnitude which is a function of the number of said further circuit portions which are switched so as to be in said third state.

11. An apparatus according to claim 1, wherein said swishing signals are each a respective bit of said multi-bit digital output.

12. An apparatus according to claim 1, wherein said analog-to-digital converter includes a plurality of comparators which each compare said analog input of said first stage to a respective different reference voltage, said multi-bit digital output of said analog-to-digital converter being a thermometer code, and each said bit of said multi-bit digital output of said analog-to-digital converter corresponding to the output of a respective said comparator.

13. An apparatus according to claim 1, including a combiner circuit having a first input port coupled to said multi-bit digital output of said first stage and having a second input port coupled to said multi-bit digital output of said second stage, said combiner circuit being operative to generate a further multi-bit digital output which is a function of said multi-bit digital outputs from said first and second stages.

14. A method of effecting pipelined analog-to-digital conversion in first and second stages of conversion which each involve use of an analog input to generate an analog output and a multi-bit digital output, said analog input of one of said first and second stages being derived from said analog output of the other of said first and second stages, said first stage comprising the steps of:

effecting an analog-to-digital conversion of said analog input of said first stage so as to generate a multi-bit digital output that is based on said analog input of said first stage and that serves as said multi-bit digital output of said first stage;

shuffling a plurality of switching signals derived from said multi-bit digital output of said analog-to-digital conversion so as to generate a plurality of shuffler output signals, said shuffling being effected according to a mapping function which relates each said shuffler output signal to a respective said switching signal, said shuffling step including the step of dynamically varying said mapping function so as to dynamically vary which of said shuffler output signals corresponds to which of said switching signals; and generating an analog residue signal which represents a difference between a magnitude corresponding to said analog input of said first stage and a magnitude corresponding to said multi-bit digital output of said analog-to-digital conversion, including the step of selectively switching each of a plurality of circuit portions to one of first and second states in response to a respective said shuffler output signal, said first and second states being different, and said analog residue signal serving as said analog output of said first stage, and having a magnitude which is a function of the number of said circuit portions which are switched so as to be in said first state.

15. A method according to claim 14, wherein said step of dynamically varying said mapping function is carried out by dynamically varying said mapping function in a substantially random manner.

16. A method according to claim 15, wherein said shuffler includes a network of switches, said network including first and second groups of switches which are mutually exclusive, and wherein said step of dynamically varying said mapping function includes the step of controlling said switches of said first group with a first substantially random signal, and controlling said switches of said second group with a second substantially random signal which is independent of said first substantially random signal.

17. A method according to claim 16, wherein said step of dynamically varying said mapping function includes the step of causing each said switching signal to pass successively through a switch in said first group and a switch in said second group.

18. A method according to claim 14, including the step of directly using each bit of said multi-bit digital output of said analog-to-digital conversion as a respective said switching signal.

19. A method according to claim 14, wherein said circuit portions each include a circuit component which has a terminal, and wherein said selectively switching step includes the step of switching said terminal of each said circuit element between two different states independence on the state of a respective said shuffler output signal.

* * * * *